(12) United States Patent
Yamaguchi

(10) Patent No.: US 7,871,905 B2
(45) Date of Patent: Jan. 18, 2011

(54) METHOD FOR PRODUCING SEMICONDUCTOR DEVICE

(75) Inventor: Kazuya Yamaguchi, Matsumoto (JP)

(73) Assignee: Fuji Electric Systems Co., Ltd. (JP)

( * ) Notice: Subject to any disclaimer, the term of this patent is extended or adjusted under 35 U.S.C. 154(b) by 0 days.

(21) Appl. No.: 12/534,502

(22) Filed: Aug. 3, 2009

(65) Prior Publication Data

US 2010/0029070 A1    Feb. 4, 2010

(30) Foreign Application Priority Data

Aug. 1, 2008    (JP) .............................. 2008-199793

(51) Int. Cl.
*H01L 21/20*    (2006.01)
(52) U.S. Cl. ..................................... 438/478
(58) Field of Classification Search ........................ None
See application file for complete search history.

(56) References Cited

U.S. PATENT DOCUMENTS

2001/0049182 A1    12/2001    Urakami et al.
2005/0221547 A1    10/2005    Yamauchi et al.

FOREIGN PATENT DOCUMENTS

| JP | 2002-124474 | 4/2002 |
|---|---|---|
| JP | 2005-317905 | 11/2005 |
| JP | 2006-019610 | 1/2006 |

*Primary Examiner*—Scott B Geyer
(74) *Attorney, Agent, or Firm*—Rossi, Kimms & McDowell LLP

(57) ABSTRACT

A method for producing a device includes embedding trenches with an epitaxial layer having high crystallinity while a mask oxide film remains unremoved. An n-type semiconductor is formed on the surface of a silicon substrate, and a mask oxide film and a mask nitride film are formed on the surface of the n-type semiconductor. The mask laminated film is opened by photolithography and etching, and trenches are formed in the silicon substrate. The width of the remaining mask laminated film is narrowed, whereby portions of the n-type semiconductor close to the opening ends of the trenches are exposed. The trenches are embedded with a p-type semiconductor, whereby the surface of the mask laminated film is prevented from being covered with the p-type semiconductor. The p-type semiconductor is grown from the second exposed portions of the n-type semiconductor. V-shaped grooves are prevented from forming on the surface of the p-type semiconductor.

3 Claims, 14 Drawing Sheets

METHOD FOR PRODUCING SEMICONDUCTOR DEVICE

BACKGROUND OF THE INVENTION

The present invention relates to a method for producing a semiconductor device, more particularly, to a method for producing a semiconductor device including a process for forming trenches in a semiconductor substrate and for embedding the trenches using the epitaxial growth method.

In semiconductor devices, such as MOSFETs (insulated gate field effect transistors), IGBTs (insulated gate bipolar transistors), bipolar transistors and diodes, if a region where a drift current flows (hereafter referred to as a drift layer) is made thinner, the current path for the drift current becomes shorter and the ON-resistance becomes lower, but the withstanding voltage is lowered. Conversely, if the drift layer is made thicker, the withstanding voltage becomes higher, but the ON-resistance is raised. As described above, a tradeoff relationship is observed between the ON-resistance and the withstanding voltage in these semiconductor devices.

As a technology for improving this tradeoff relationship, a technology relating to a super-junction structure is known. The super-junction structure is characterized in that the drift layer is not a single semiconductor layer but has s structure wherein an n-type semiconductor region and a p-type semiconductor region, each having a high impurity concentration, are joined alternately and repeatedly (hereafter referred to as a parallel pn structure). As a method for forming the parallel pn structure, a method has been proposed in which trenches are formed in an n-type drift layer by dry etching and the trenches are embedded with an epitaxially grown p-type semiconductor.

As a method for forming trenches in a silicon substrate, the so-called Bosch process is known. In the Bosch process, anisotropic etching is advanced by performing an etching process and a passivation process alternately and repeatedly.

As a method for growing an epitaxial layer having high crystallinity inside the trenches formed by the above-mentioned method, the method described below has been proposed. Trenches are formed in a first conductive type semiconductor substrate. The inner walls of the trenches are washed with dilute fluorinated acid or buffered fluorinated acid and washed with pure water, and then dried. This substrate is placed in a gas furnace, an etching gas containing hydrogen and a carrier gas containing HCl or $Cl_2$ are supplied into the gas furnace, the exposed faces inside the trenches are etched by approximately several nm to 1 μm, and the exposed faces inside the trenches are cleaned. Furthermore, the trenches are formed into a shape opening wider upward by this etching. Following the etching process, annealing is carried out under hydrogen atmosphere, and a growth gas, an etching gas, a doping gas and a carrier gas are supplied into the furnace to allow a second conductive type semiconductor to be epitaxially grown inside the trenches so that the trenches are embedded with the semiconductor (for example, refer to Japanese Patent Application Laid-open Publication No. 2006-019610).

However, when the trenches are embedded with the epitaxially grown p-type semiconductor, if the mask oxide film used for trench forming remains, the following problems occur. FIG. 25 is a sectional view showing an epitaxial layer grown so as to cover the surface of the mask oxide film according to a conventional production method. In addition, FIG. 26 is a sectional view showing an epitaxial layer having embedding defects. As shown in FIG. 25, when the trenches are embedded with a p-type semiconductor 31, the p-type semiconductor 31 protruding above the mask oxide film 23 (hereafter referred to as an over epitaxial layer) is formed so as to cover the surface of the mask oxide film 23. At this time, a stress is generated between the mask oxide film 23 and the p-type semiconductor 31 grown on the surface of the mask oxide film 23, whereby crystal defects occur on the surface layer of the p-type semiconductor 31. The occurrence of these crystal defects ranges up to the p-type semiconductor 31 close to the opening portions of the trenches, and the crystal defects remain in the surface layer of the p-type semiconductor 31 after the over epitaxial layer is removed by surface polishing or the like. The crystal defects remaining in the surface layer of the p-type semiconductor 31 become a cause of increase in leak current. Hence, for the purpose of avoiding the influence of the stress caused by the over epitaxial layer, as shown in FIG. 26, embedding is completed before a p-type semiconductor 32 is grown on the surface of the mask oxide film 23 so that the over epitaxial layer is not formed. However, in this case, V-shaped grooves are formed on the surface layer of the p-type semiconductor 32. Even if the surface of the semiconductor device is smoothed by performing a subsequent process, the V-shaped grooves remain on the surface of the p-type semiconductor 32, and embedding defects occur eventually in the p-type semiconductor 32. For this reason, for the purpose of preventing these embedding defects, epitaxial growth is required to be continued until the over epitaxial layer is formed.

Hence, as a method for avoiding the above-mentioned problems, the following method has been proposed in which, after a mask oxide film is removed, trenches are embedded with a p-type semiconductor. More specifically, a mask oxide film for trench etching is formed on the upper face of a silicon substrate, and etching is performed using the mask oxide film to form trenches in the silicon substrate. After the mask oxide film is removed, heat treatment is performed under non-oxidizing or non-nitriding reduced-pressure atmosphere to smooth the inner faces of the trenches in the silicon substrate. Furthermore, an epitaxial film is formed inside the trenches by the epitaxial growth method so that the trenches are embedded with the epitaxial film. Then, the surface of the epitaxial film on the substrate is flattened (for example, refer to Japanese Patent Application Laid-open Publication No. 2002-124474).

Furthermore, as another method, the following method has been proposed. This method is a method for producing a semiconductor substrate in which, after trenches are formed in a silicon substrate, an epitaxial film is formed on the surface of the silicon substrate including the bottom and side faces of the trenches, and the trenches are embedded with the epitaxial film, wherein, at least in the final process of embedding at the time when the trenches are embedded with the epitaxial film, the growth speed of the epitaxial film, which is grown on the side faces of the trenches, at the opening portions of the trenches is made lower than the growth speed at portions deeper than the opening portions of the trenches as a condition for forming the epitaxial film. At that time, an oxide film formed on the silicon substrate is used as a mask when the trenches are formed in the silicon substrate, and the oxide film used as the mask is removed after the trenches are formed and before the epitaxial film is formed (for example, refer to Japanese Patent Application Laid-open Publication No. 2005-317905).

However, the mask oxide film used to form the trenches can be used in subsequent processes to improve the efficiency of the production processes. A method for using the mask oxide film is, for example, as described below. With a configuration in which the mask pattern formed on the mask oxide film is recognized using an exposure apparatus or the like, the mask pattern can be used as a mark for positional alignment between a semiconductor substrate and a photomask, that is, as an alignment marker. Moreover, in a process of smoothing the surface of the semiconductor substrate by CMP (Chemical Mechanical Polishing) or the like, the level of the mask oxide film can be used as the reference level at which the polishing is ended. For these reasons, it is desirable that the mask oxide film should remain unremoved in processes after the formation of the parallel pn structure.

In view of the above, it would be desirable to provide a method for producing a semiconductor device having a super-junction structure, wherein, while a mask used for trench forming remains unremoved, an epitaxial layer having high crystallinity is formed inside the trenches to produce a semiconductor device having excellent device properties.

SUMMARY OF THE INVENTION

The prevent invention provides a method for producing a semiconductor device having a super-junction structure, wherein, while a mask used for trench forming remains unremoved, an epitaxial layer having high crystallinity is formed inside the trenches to produce a semiconductor device having excellent device properties.

A method for producing a semiconductor device according to the invention has the following characteristics., a first masking process is performed to form a first mask being open partially on the main face of a first conductive type semiconductor substrate. Next, an etching process is performed to form trenches by etching the semiconductor portions of the first conductive type semiconductor substrate exposed to the opening portions in the first mask. Then, an exposing process is performed in which the width of each opening portion in the first mask is widened and the semiconductor portions on the surface of the first conductive type semiconductor substrate, remaining without being etched after the etching process, are exposed. Next, a layer forming process is performed in which a second conductive type semiconductor layer is epitaxially grown in the trenches and the semiconductor portions of the first conductive type semiconductor substrate exposed in the exposing process.

In addition, the width the opening portions in the first mask is preferably widened by using a mask formed of a resist film, a nitride film or an oxide film in the exposing process.

Furthermore, the first mask is preferably formed of an oxide film, a nitride film or a laminated film of an oxide film and a nitride film.

Moreover, a method for producing a semiconductor device according to the invention has the following characteristics. First, a first masking process is performed to form a first mask being open partially on the main face of a first conductive type semiconductor substrate. Next, a second masking process is performed to laminate a second mask having a width narrower than that of the first mask on the surfaces of the remaining portions of the first mask. Then, an etching process is performed to form trenches by etching the semiconductor portions of the first conductive type semiconductor substrate exposed to the opening portions in the first mask and the opening portions in the second mask. Then, an exposing process is performed in which the width of the first mask is narrowed using the second mask and the semiconductor portions on the surface of the first conductive type semiconductor substrate, remaining without being etched after the etching process, are exposed. Next, a layer forming process is performed in which a second conductive type semiconductor layer is epitaxially grown in the trenches and the semiconductor portions of the first conductive type semiconductor substrate exposed in the exposing process.

The first mask is preferably an oxide film or a nitride film.

What's more, the second mask is preferably a resist film, a nitride film or an oxide film.

Still further, the layer forming process performs epitaxial growth inside a chamber to which a mixed gas of a silicon source gas and a halide gas is supplied.

According to the present invention, the second conductive type semiconductor is not grown on the surface of the first mask formed on the surface of the first conductive type semiconductor substrate. It is thus possible to prevent crystal defects from occurring on the surface layer of the second conductive type semiconductor due to the influence of the over epitaxial layer and it is also possible to reduce the leak current in the device. Furthermore, since, after the trenches are formed, the second conductive type semiconductor is grown from the surface of the first conductive type semiconductor substrate exposed by removing part of the remaining portions of the first mask, it is possible to prevent V-shaped grooves from being formed on the surface of the second conductive type semiconductor and close to the opening portions of the trenches. Hence, the trenches can be completely embedded with the second conductive type semiconductor without forming an over epitaxial layer. Consequently, it is possible to prevent embedding defects from occurring on the surface of the second conductive type semiconductor.

Since the second mask is formed on the surface of the first mask, the total thickness of the mask laminated film formed on the surface of the first conductive type semiconductor substrate becomes sufficiently large. Hence, the second conductive type semiconductor is not grown on the surface of the second mask.

With a method for producing a semiconductor device according to the present invention, in the production of a semiconductor device having a super-junction structure, it is possible to reduce crystal defects occurring in epitaxial layers formed on semiconductor substrates. Furthermore, it is possible to prevent embedding defects in epitaxial layers. Hence, while a mask used for trench forming remains unremoved, an epitaxial layer having high crystallinity is formed inside the trenches, whereby it is possible to obtain an effect capable of producing a semiconductor device having excellent device properties.

Other features, objects, advantages, embodiments, etc., will become apparent to those skilled in the art from the following detailed description of the preferred embodiments of the invention.

BRIEF DESCRIPTION OF THE DRAWINGS

The invention will be described with reference to certain preferred embodiments thereof including the accompanying drawings, wherein.

DESCRIPTION OF THE PREFERRED EMBODIMENTS

A method for producing a semiconductor device according to preferred embodiments of the present invention will be described below in detail referring to the accompanying drawings. In the specification and the accompanying drawings, in layers and regions beginning with n, electrons are the majority carriers, and in layers and regions beginning with p, holes are the majority carriers. Furthermore, layers and regions with a + mark attached to n have impurity concentrations higher than those of layers and regions without the mark. Moreover, in the following descriptions of the embodiments and the accompanying drawings, similar components are designated by the same numerals, and overlapping descriptions are omitted.

Figure 1:
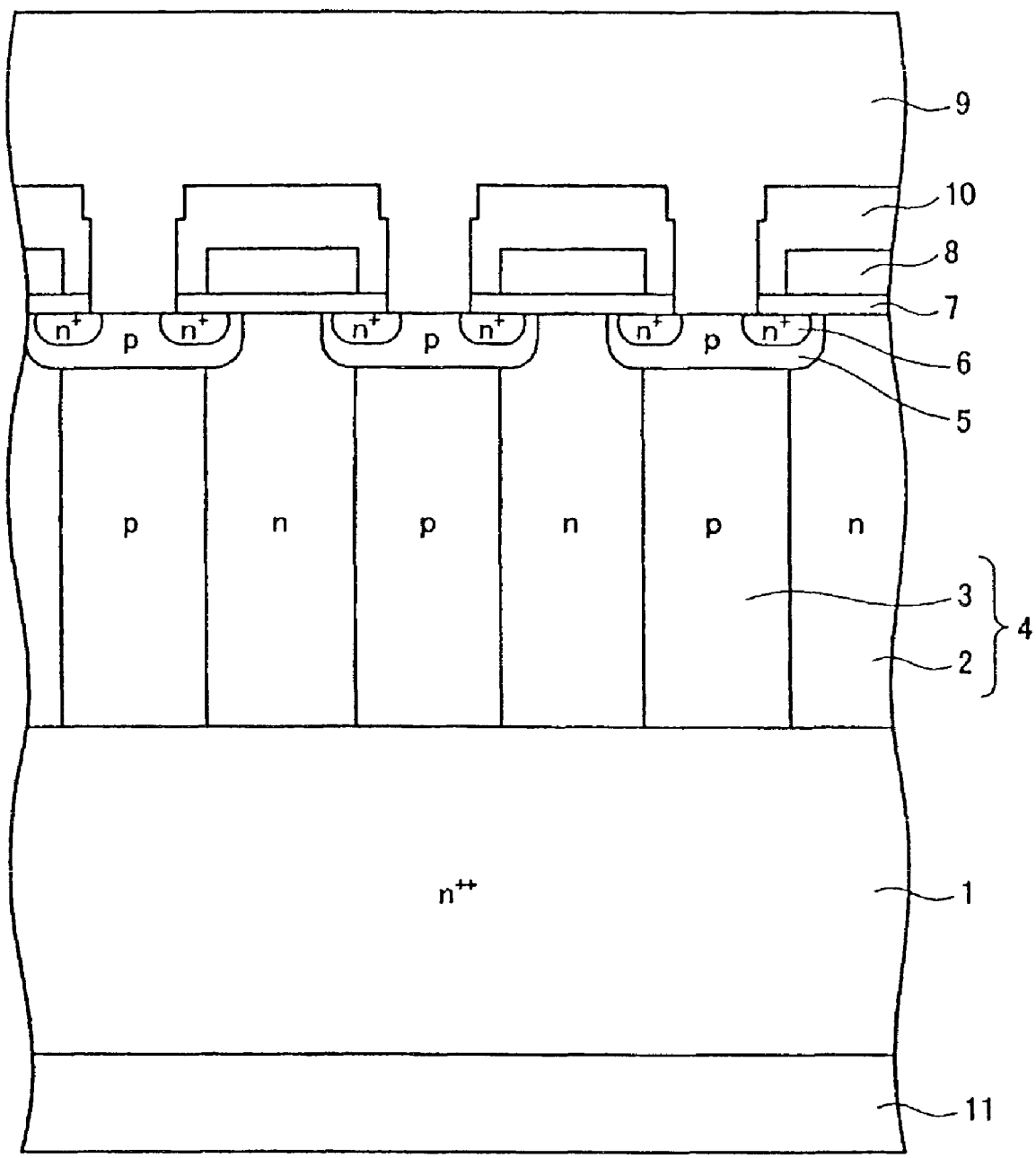
FIG. 1 is a sectional view showing an example of a super-junction semiconductor device produced by a production method according to the present invention.

FIG. 1 is a sectional view showing an example of a superjunction semiconductor device produced by a production method according to the present invention. A vertical MOSFET is herein taken as an example and described. As shown in FIG. 1, a parallel pn structure 4 constituted by alternately and repeatedly joining an n-type semiconductor region 2 and a p-type semiconductor region 3 is provided on an $n^{++}$ drain layer 1 having a low resistance. A p-type base region 5 having a high impurity concentration is provided on the surface layer of the p-type semiconductor region 3 of the parallel pn structure 4. On the surface layer of the p-type base region 5, $n^+$ source regions 6 having a high impurity concentration are provided.

Between the n-type semiconductor region 2 of the parallel pn structure 4 and the $n^+$ source region 6, above the surface of the p-type base region 5, a gate electrode 8 is provided via a gate oxide film 7. A source electrode 9 makes contact with the p-type base region 5 and the $n^+$ source regions 6. The source electrode 9 is insulated from the gate electrode 8 by an interlayer insulation film 10. A drain electrode 11 is provided on the rear side of the $n^{++}$ drain layer 1. The surface of this semiconductor device is covered with a surface protection film (not shown).

Figure 2:
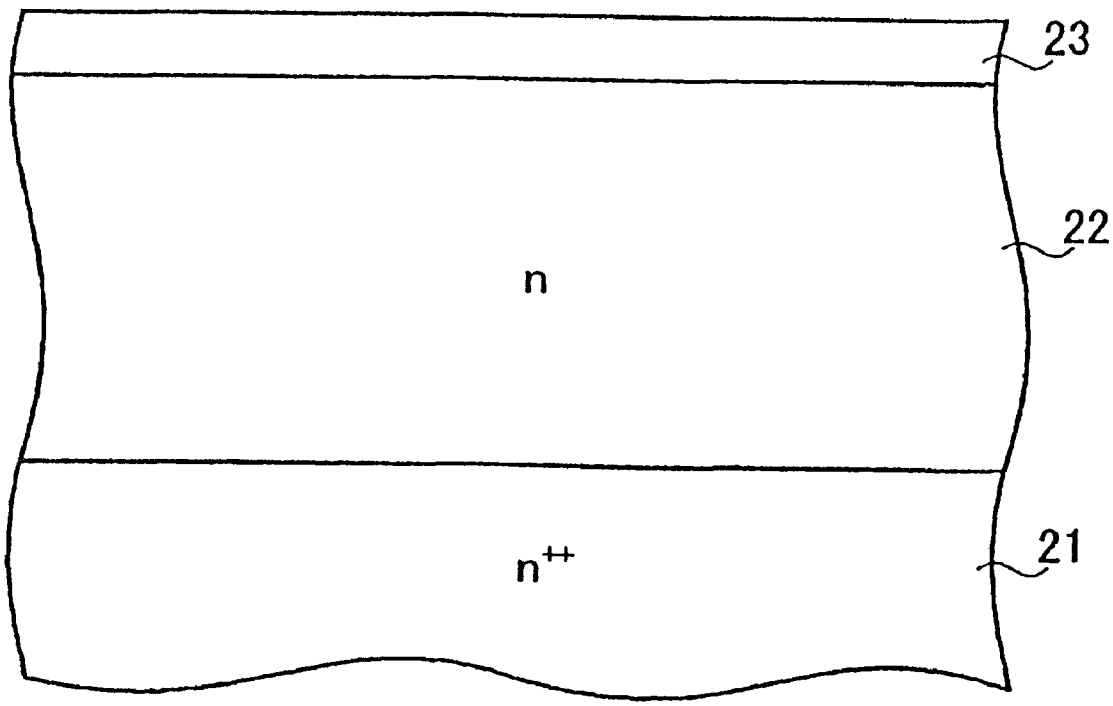
FIG. 2 is a sectional view showing a semiconductor device produced by a production method according to Embodiment 1.
Figure 3:
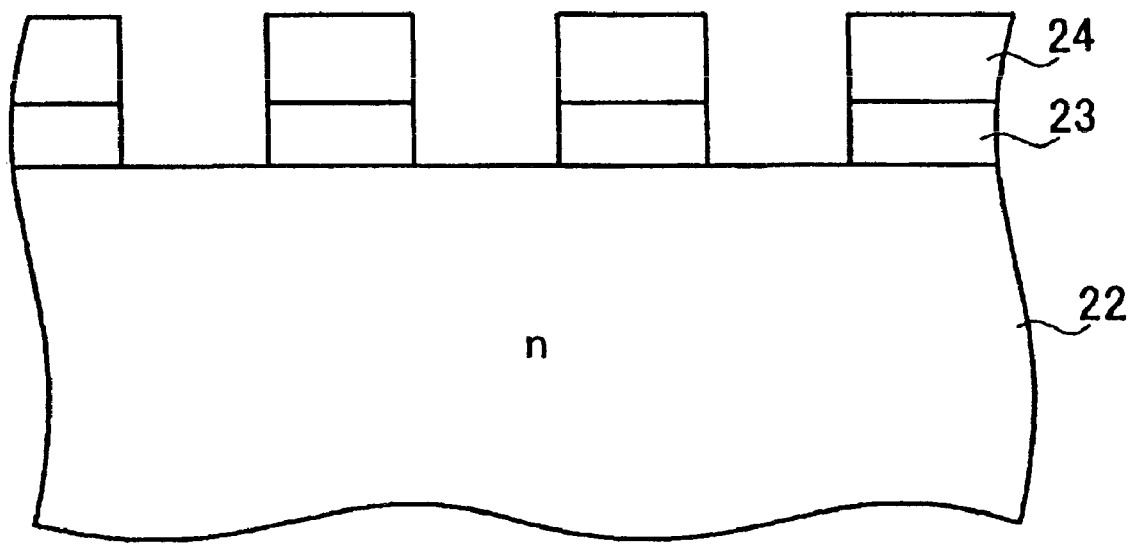
FIG. 3 is a sectional view showing the semiconductor device produced by the production method according to Embodiment 1.

FIGS. 2 to 11 are sectional views showing a semiconductor device produced by a production method according to Embodiment 1. First, an n-type low-resistance silicon substrate ($n^{++}$ substrate) 21 is prepared, and an n-type semiconductor 22 is epitaxially grown on the surface of the substrate. The n-type low-resistance silicon substrate 21 serves as the $n^{++}$ drain layer 1. Next, a mask oxide film 23 is formed on the surface of the n-type semiconductor 22 by a thermal oxidation method, such as a pyrogenic oxidation method (FIG. 2). Then, a mask nitride film 24 is formed on the surface of the mask oxide film 23. Next, a resist film (not shown) is applied to the surface of the mask nitride film 24. Then, the mask oxide film 23 and the mask nitride film 24 (hereafter referred to as a mask laminated film) are opened at portions above trench forming regions by photolithography and etching. Then, the resist film is removed (FIG. 3).

Figure 4:
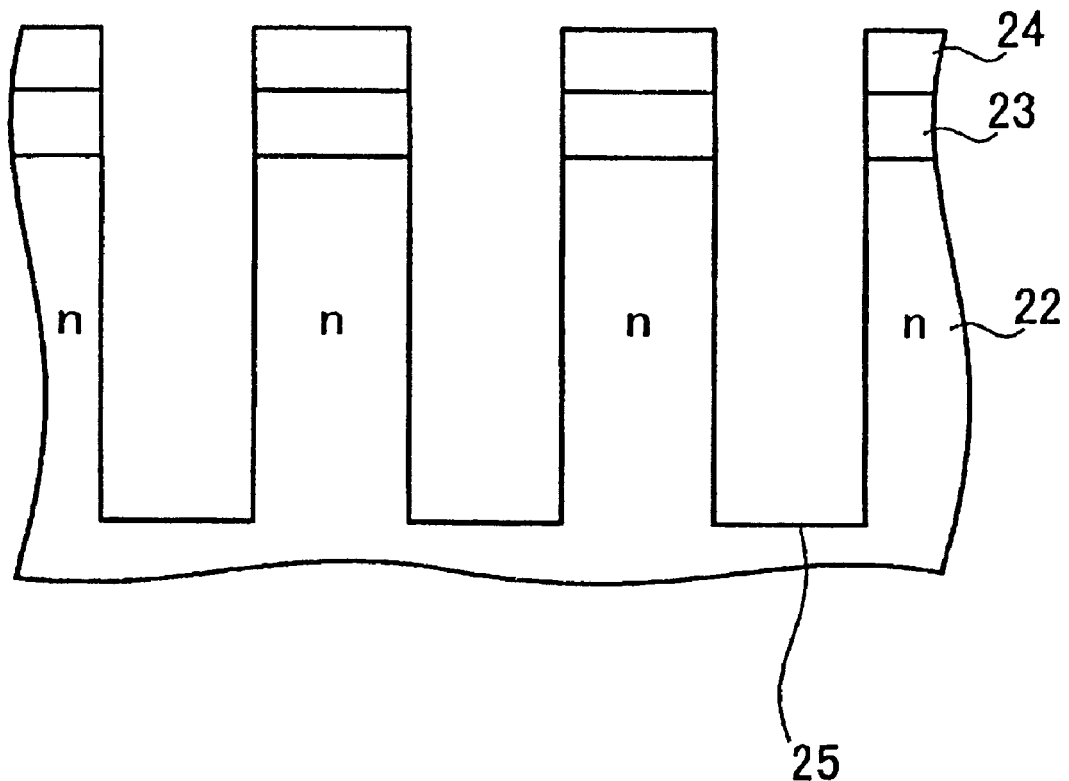
FIG. 4 is a sectional view showing the semiconductor device produced by the production method according to Embodiment 1.

Next, for example, the semiconductor device being in the state shown in FIG. 3 is placed in a chamber (not shown), and the portions of the n-type semiconductor 22, exposed to the opening portions of the mask laminated film (hereafter referred to as first exposed portions), are etched to form trenches 25 while alternately supplying a protection film forming gas and an etching gas every several seconds into the chamber as shown in FIG. 4. At this time, when the trenches 25 are formed, the mask nitride film 24 is also etched slightly. The portions of the n-type semiconductor 22 remaining after the trenches are formed serve as the n-type semiconductor regions 2 of the parallel pn structure 4.

Figure 5:
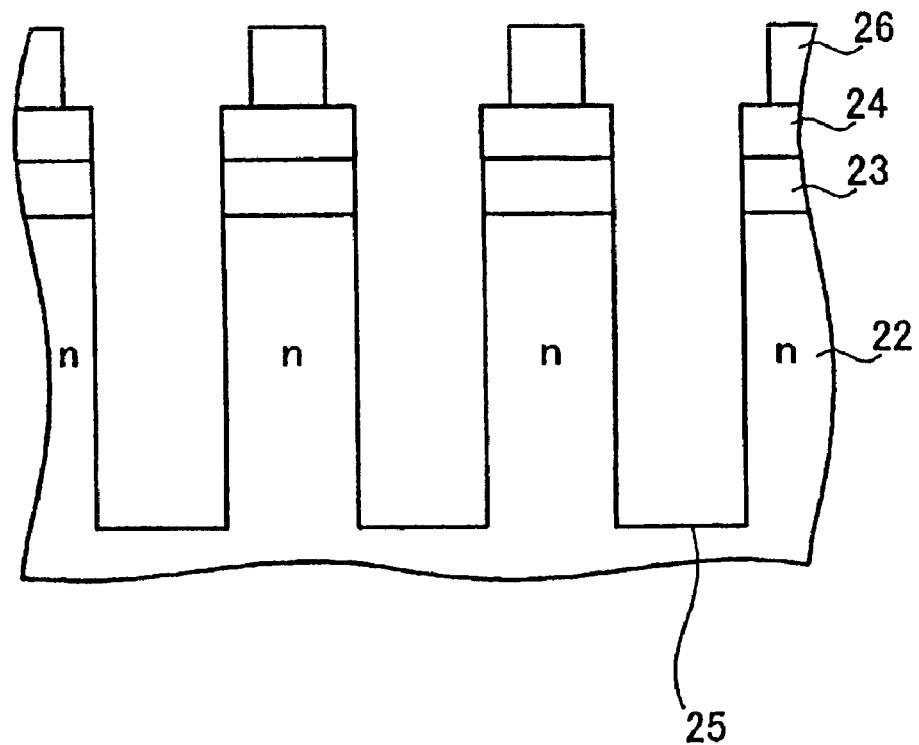
FIG. 5 is a sectional view showing the semiconductor device produced by the production method according to Embodiment 1.

Next, the semiconductor device being in the state shown in FIG. 4 is taken out from the chamber, and a resist film 26 is applied to the surface of the mask laminated film. Then, the resist film 26 is subjected to photolithography so that the width of the resist film 26 is made narrower than the width of the mask laminated film (FIG. 5). At this time, the resist film 26 is positioned at the nearly central position on the surface of the mask nitride film 24. Next, etching is performed by using the remaining resist film 26 as a mask, whereby the width of the mask laminated film is narrowed so that only the central portion of the mask laminated film remains. At this time, the width of the mask oxide film 23 becomes equal to that of the mask nitride film 24. Hence, the portions of the n-type semiconductor 22 close to the opening ends of the trenches 25 (hereafter referred to as second exposed portions) are exposed. Then, the resist film 26 is removed (FIG. 6).

Figure 6:
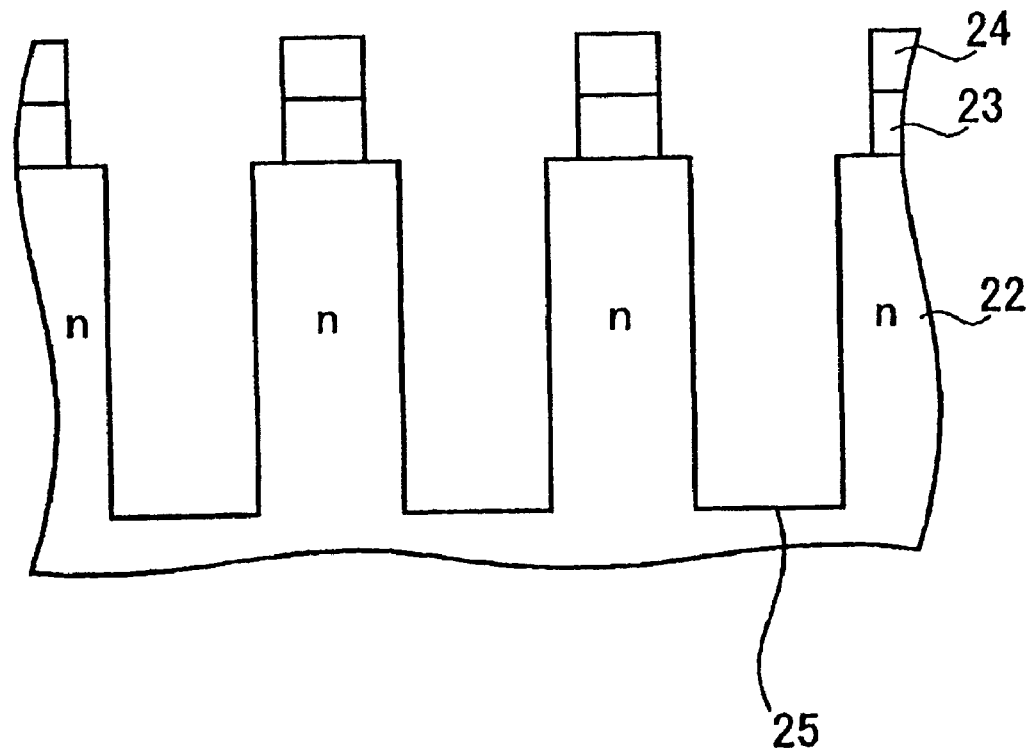
FIG. 6 is a sectional view showing the semiconductor device produced by the production method according to Embodiment 1.
Figure 7:
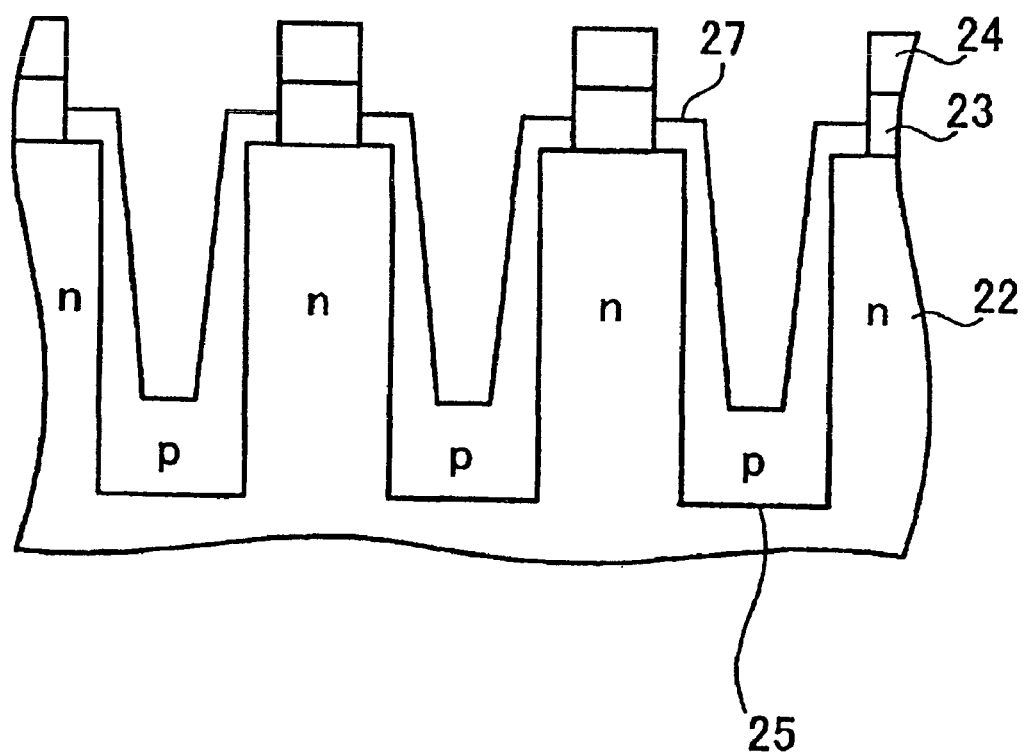
FIG. 7 is a sectional view showing the semiconductor device produced by the production method according to Embodiment 1.
Figure 8:
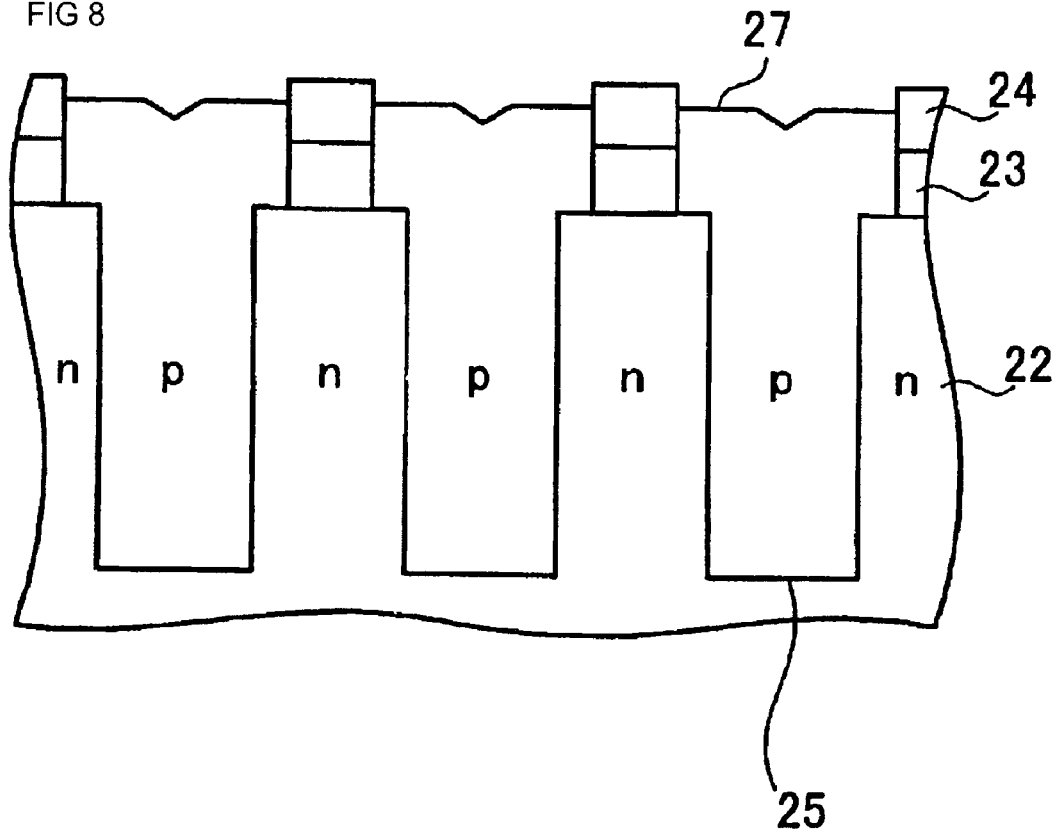
FIG. 8 is a sectional view showing the semiconductor device produced by the production method according to Embodiment 1.

Next, for example, the semiconductor device being in the state shown in FIG. 6 is placed in an epitaxial growth system (not shown) and subjected to heat treatment, whereby the inner faces of the trenches 25 (the side and bottom faces of the trenches) are smoothed. Then, as shown in FIG. 7, a p-type semiconductor 27 is grown inside the trenches 25 by the epitaxial growth method. At this time, the p-type semiconductor 27 is also grown from the second exposed portions of the n-type semiconductor 22. Then, the p-type semiconductor 27 is grown continuously, whereby the trenches 25 are embedded with the p-type semiconductor 27 as shown in FIG. 8. At this time, the trenches 25 are embedded with the p-type semiconductor 27 to a height as high as the surface of the n-type semiconductors 22 obtained after the surface of the parallel pn structure 4 is smoothed and to a height to the extent that V-shaped grooves do not remain on the surface of the parallel pn structure 4. However, since the mask laminated film is thick, the surface of the p-type semiconductor 27 becomes lower than the surface of the mask nitride film 24. The p-type semiconductor 27 serves as the p-type semiconductor region 3 of the parallel pn structure 4.

Figure 9:
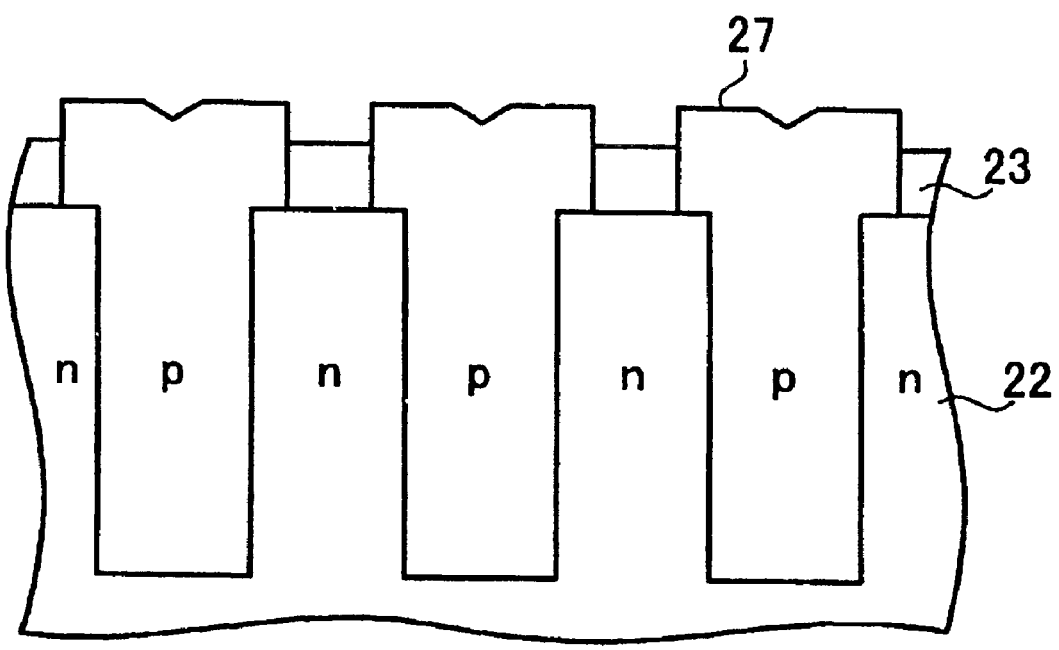
FIG. 9 is a sectional view showing the semiconductor device produced by the production method according to Embodiment 1.
Figure 10:
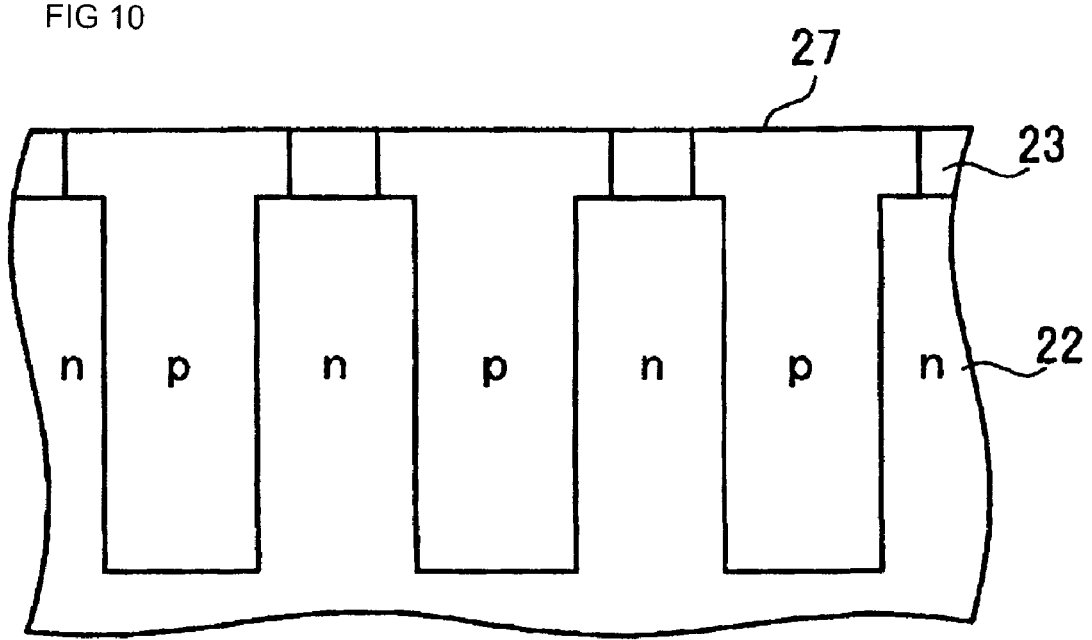
FIG. 10 is a sectional view showing the semiconductor device produced by the production method according to Embodiment 1.
Figure 11:
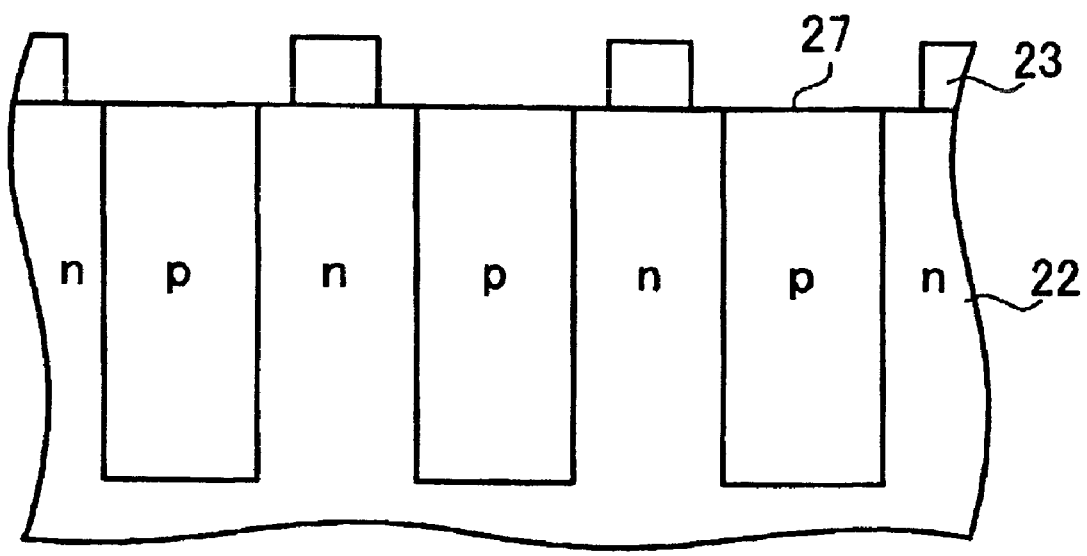
FIG. 11 is a sectional view showing the semiconductor device produced by the production method according to Embodiment 1.

Next, as shown in FIG. 9, only the mask nitride film 24 of the mask laminated film is removed by wet etching or plasma etching, for example. Next, as shown in FIG. 10, polishing, such as CMP, is performed while the level of the mask oxide film 23 is used as the reference level at which the polishing is ended, thereby removing the silicon layer protruding above the mask oxide film 23. Next, as shown in FIG. 11, the portions of the p-type semiconductor 27 protruding above the surface of the n-type semiconductor 22 are removed by silicon etching, for example, whereby the surface layer of the parallel pn structure 4 is smoothed.

Then, as shown in FIG. 1, a field oxide film (not shown) formed of a tetraethoxysilane (TEOS) film, a gate oxide film 7 and a gate electrode 8 are formed sequentially by performing the ordinary MOSFET production processes. Next, a gate electrode pattern is formed on the surface of the semiconductor substrate. Then, the p-type base regions 5 are formed by self-aligned ion implantation and thermal diffusion. Furthermore, the n+ source regions 6, the interlayer insulation films (BPSG) 10, the source electrode 9, the surface protection film (not shown) and the drain electrode 11 are formed, whereby a vertical MOSFET having a planar gate structure is completed.

Examples of the dimensions and impurity concentrations of various portions, process conditions, etc. are given below. However, the present invention is not limited to these values. In addition, the ratio of the mixed gas may vary depending on the deposition rate, the size and aspect ratio of the trench, etc. A semiconductor device having a withstanding voltage of 600 V is herein taken as an example and described. The thickness and concentration of the n-type low-resistance substrate 21 are 625 μm and $4 \times 10^{18}$ cm$^{-3}$, respectively, for example. The thickness and concentration of the n-type semiconductor 22 are 55 μm and $4 \times 10^{15}$ cm$^{-3}$, respectively, for example. The thickness of the mask oxide film 23 is 0.8 μm, for example. The thickness of mask nitride film 24 immediately after its formation is 1.6 μm, for example. The opening width and depth of the trench are 6 μm and 45 μm, respectively, for example. The trench is formed with a depth not reaching the n-type low-resistance substrate 21. The distance between a trench and another trench adjacent thereto is 6 μm, for example. Furthermore, in the etching process for forming the trenches, the mask nitride film 24 is also etched. The thickness of the mask nitride film 24 remaining after the trench etching is 1.2 μm, for example. The heat treatment inside the trenches is carried out at 950 to 1150° C. under hydrogen atmosphere at normal pressure, for example. The formation of the epitaxial layer inside the trenches to be carried out subsequently is also performed in the same conditions. Furthermore, the gas to be supplied into the chamber for forming the epitaxial layer is a mixed gas of a silicon source gas and an etching gas. As the silicon source gas, trichlorosilane (SiHCl$_3$) is used, for example. As the etching gas, hydrogen chloride (HCl) is used, for example. At this time, the silicon source gas and the etching gas are supplied at a ratio of 6 to 1, for example.

Even when the trenches are completely embedded with the p-type semiconductor 27, the thickness of the mask laminated film is sufficiently large to the extent that the p-type semiconductor 27 is not grown on the surface of the mask laminated film. In addition, since the second exposed portions are present on the surface of the n-type semiconductor 22, the p-type semiconductor 27 is epitaxially grown also from the second exposed portions.

Since the mask nitride film 24 is formed on the surface of the mask oxide film 23 according to Embodiment 1 as described above, the total thickness of the mask laminated film formed on the surface of the n-type semiconductor 22 becomes sufficiently large. Hence, the p-type semiconductor 27 is not grown on the surface of the mask laminated film. It is thus possible to prevent crystal defects from occurring on the surface layer of the p-type semiconductor 27 due to the influence of the over epitaxial layer and it is also possible to reduce the leak current in the device. Furthermore, since the p-type semiconductor 27 is grown from the second exposed portions, it is possible to prevent V-shaped grooves from being formed on the surface of the p-type semiconductor 27 and close to the opening portions of the trenches. Hence, the trenches can be completely embedded with the p-type semiconductor 27 without forming an over epitaxial layer above the mask laminated film. Consequently, it is possible to prevent embedding defects from occurring on the surface of the p-type semiconductor 27.

Figure 12:
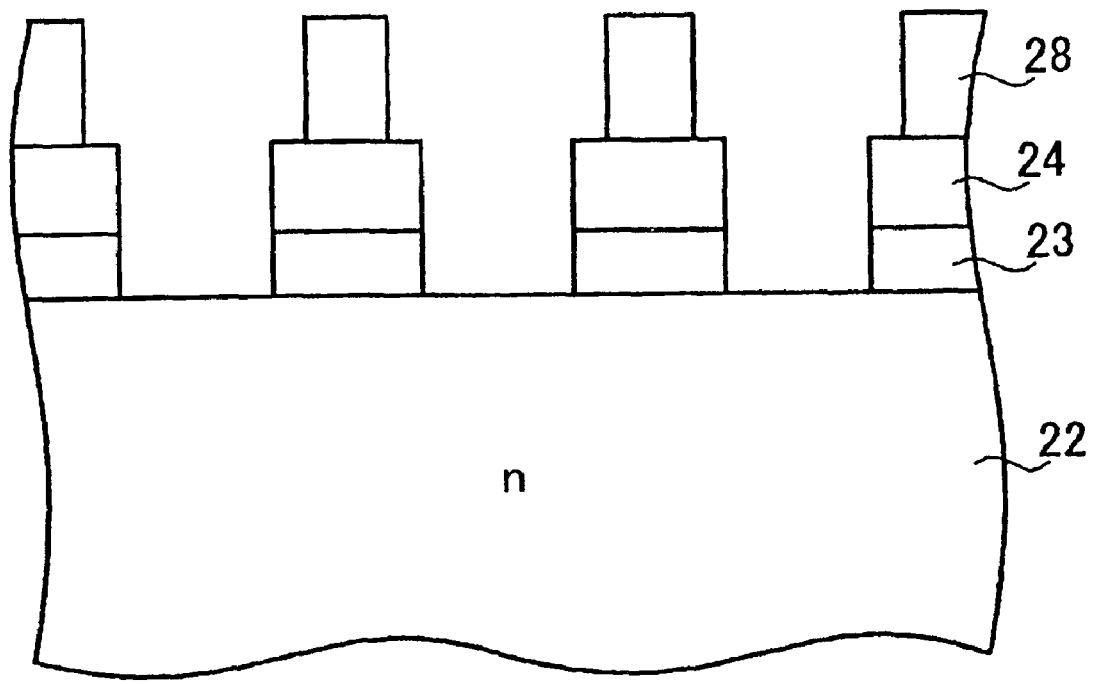
FIG. 12 is a sectional view showing a semiconductor device produced by a production method according to Embodiment 2.
Figure 13:
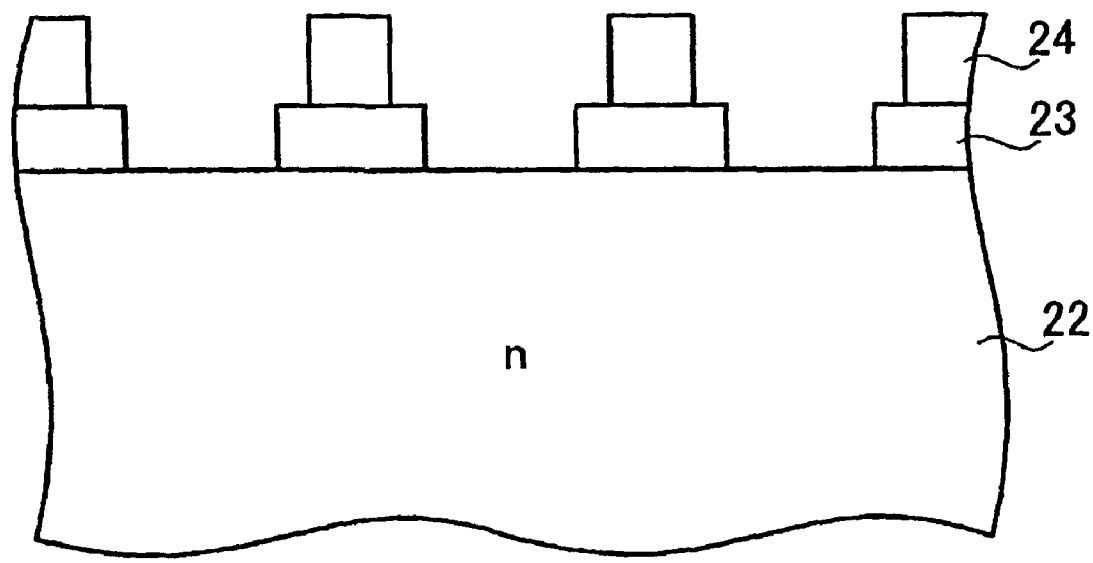
FIG. 13 is a sectional view showing the semiconductor device produced by the production method according to Embodiment 2.
Figure 14:
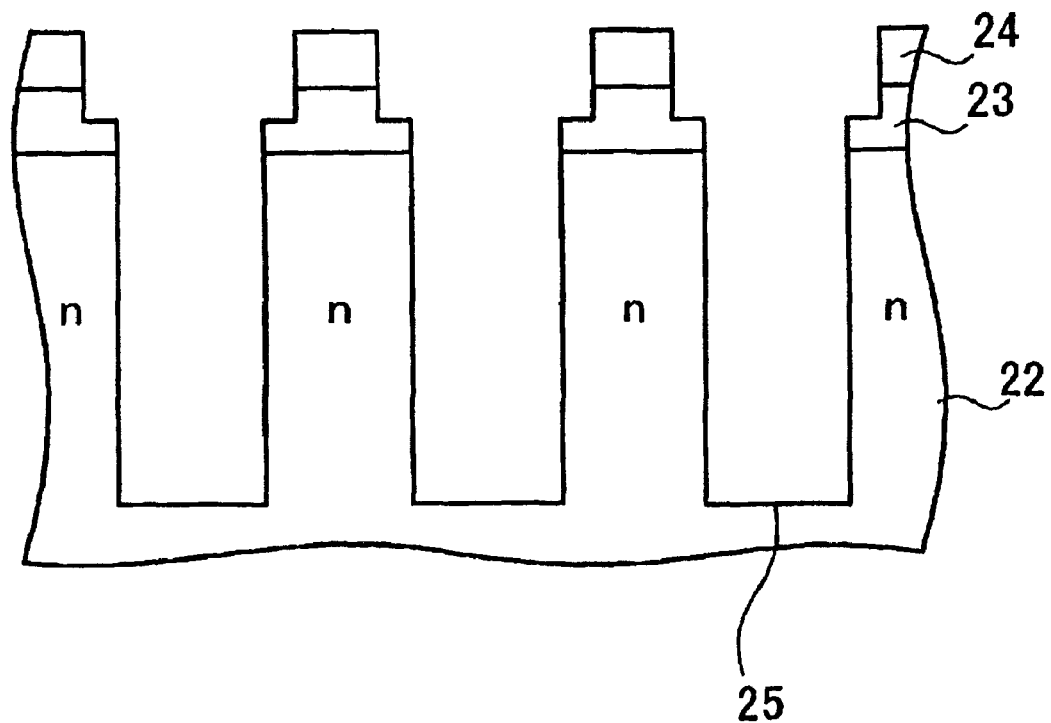
FIG. 14 is a sectional view showing the semiconductor device produced by the production method according to Embodiment 2.

A method for producing a semiconductor device according to Embodiment 2 will be described below. The descriptions and accompanying drawings of Embodiment 2 overlapping with those of Embodiment 1 will be omitted. FIGS. 12 to 14 are sectional views showing a semiconductor device produced by the production method according to Embodiment 2. First, as shown in FIGS. 2 and 3, as in Embodiment 1, the n-type semiconductor 22 is formed on the surface of the n-type low-resistance silicon substrate 21, and the mask oxide film 23 and the mask nitride film 24 are formed on the surface of the n-type semiconductor 22, and the mask laminated film (the mask oxide film 23 and the mask nitride film 24) is opened.

Next, a resist film 28 is applied to the surface of the mask laminated film. Then, the resist film 28 is subjected to photolithography so that the width of the resist film 28 is made narrower than the width of the remaining mask laminated film (FIG. 12). At this time, the resist film 28 is positioned at the nearly central position on the surface of the mask nitride film 24. Next, etching is performed by using the remaining resist film 28 as a mask, whereby the width of the mask nitride film 24 of the mask laminated film is narrowed so that only the central portion of the mask nitride film 24 remains. At this time, part of the surface of the mask oxide film 23 is exposed, and the mask laminated film has a convex shape. Then, the resist film 28 is removed (FIG. 13).

Next, as shown in FIG. 14, the portions of the n-type semiconductor 22, exposed to the opening portions of the mask laminated film (first exposed portions), are etched to form the trenches 25. The method for forming the trenches 25 is similar to that described in Embodiment 1. At this time, when the trenches 25 are formed, the exposed portions of the surface of the mask oxide film 23 and the mask nitride film 24 are also etched slightly. In Embodiment 2, the thickness of the mask nitride film 24 after the trench formation is similar to that described in Embodiment 1.

Next, etching is performed by using the mask nitride film 24 as a mask, whereby the width of the mask oxide film 23 is narrowed so that only the central portion of the mask oxide film 23 remains. At this time, as shown in FIG. 6, the width of the mask oxide film 23 becomes equal to that of the mask nitride film 24. Hence, the portions of the n-type semiconductor 22 close to the opening ends of the trenches 25 (second exposed portions) are exposed. Subsequent processes are similar to those described in Embodiment 1.

As described above, Embodiment 2 can obtain effects similar to those of Embodiment 1. When etching is performed to form the trenches 25, the mask oxide film 23 is also etched and thinned. Hence, the etching time in the process of narrowing the width of the mask oxide film 23, performed subsequently, can be made shorter than that in Embodiment 1. Furthermore, since the mask nitride film 24 can be used as an etching mask at this time, a special process for forming a mask to narrow the width of the mask oxide film 23 is not required to be added. Hence, the process for forming the parallel pn structure 4 can be made efficiently.

Figure 15:
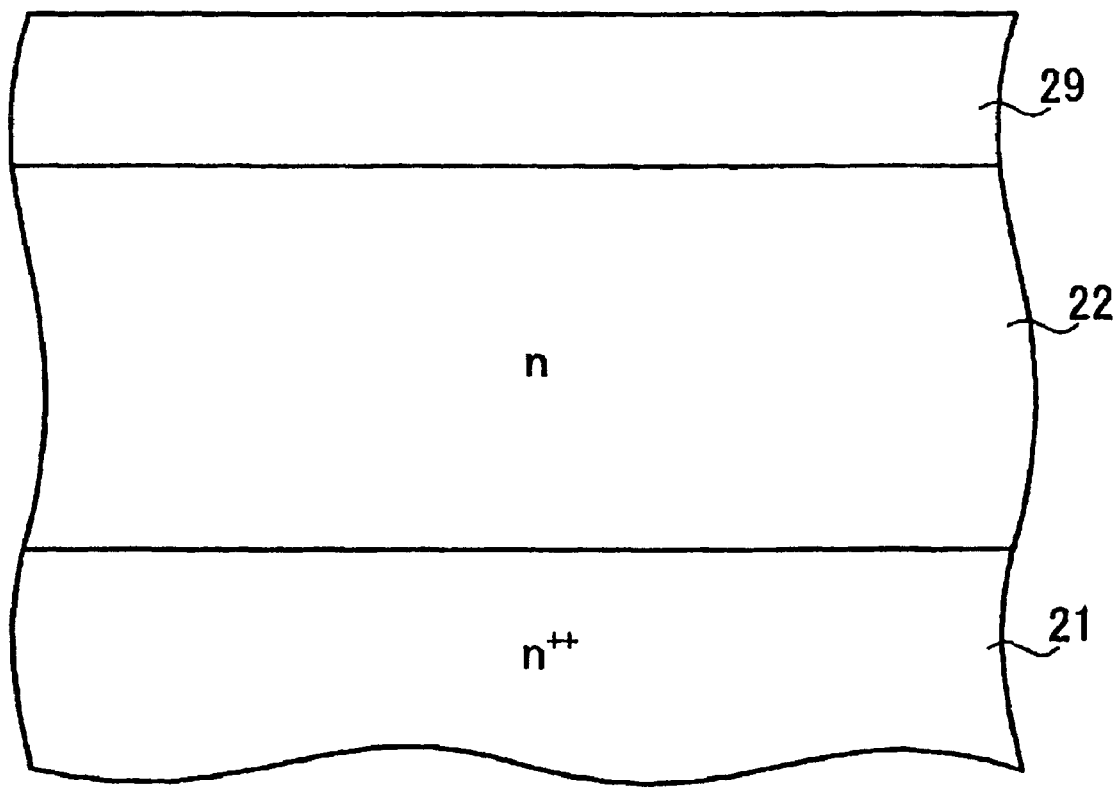
FIG. 15 is a sectional view showing a semiconductor device produced by a production method according to Embodiment 3.
Figure 16:
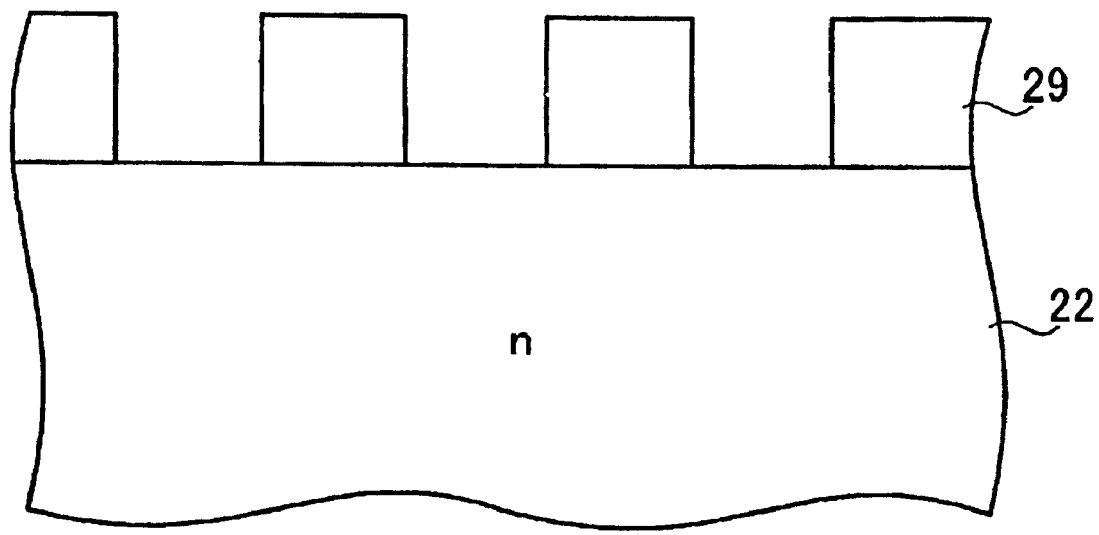
FIG. 16 is a sectional view showing the semiconductor device produced by the production method according to Embodiment 3.

A method for producing a semiconductor device according to Embodiment 3 will be described below. The descriptions and accompanying drawings of Embodiment 3 overlapping with those of Embodiment 1 will be omitted. FIGS. 15 to 24 are sectional views showing a semiconductor device produced by the production method according to Embodiment 3. First, as in Embodiment 1, the n-type semiconductor 22 is epitaxially grown on the surface of the n-type low-resistance silicon substrate ($n^{++}$ substrate) 21. Next, a mask oxide film 29 is formed on the surface of the n-type semiconductor 22 by a thermal oxidation method, such as a pyrogenic oxidation method (FIG. 15). Next, a resist film (not shown) is applied to the surface of the mask oxide film 29. Then, the mask oxide film 29 is opened at portions on trench forming regions by photolithography and etching as shown in FIG. 16. Then, the resist film is removed.

Figure 17:
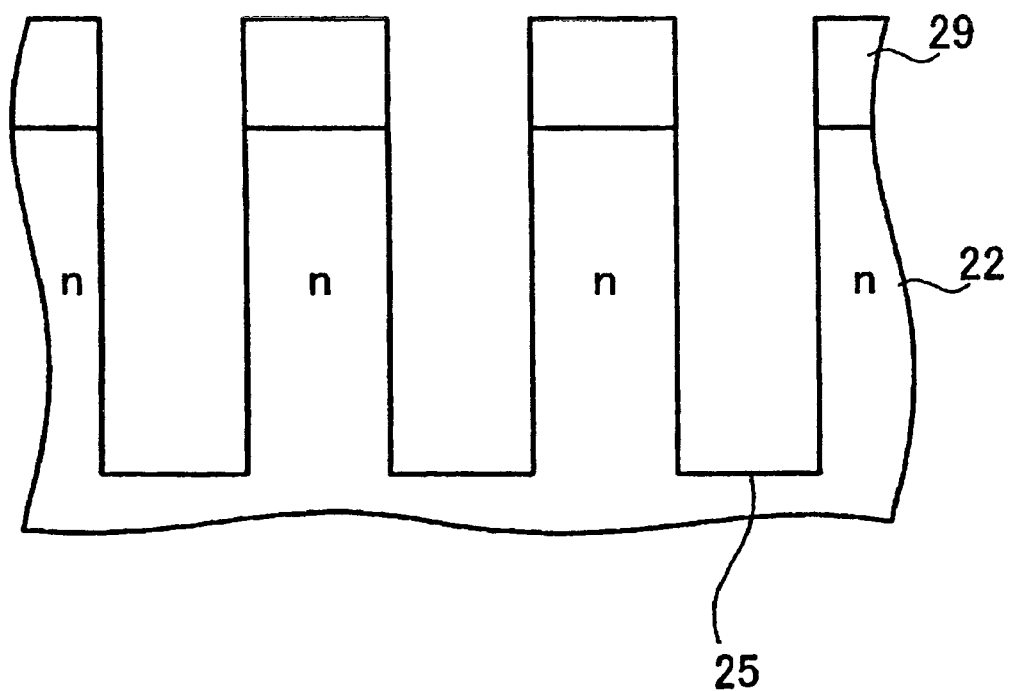
FIG. 17 is a sectional view showing the semiconductor device produced by the production method according to Embodiment 3.

Next, as shown in FIG. 17, the portions of the n-type semiconductor 22, exposed to the opening portions of the mask oxide film 29 (first exposed portions), are etched to form the trenches 25. The method for forming the trenches 25 is similar to that described in Embodiment 1. At this time, when the trenches 25 are formed, the mask oxide film 29 is also etched slightly.

Figure 18:
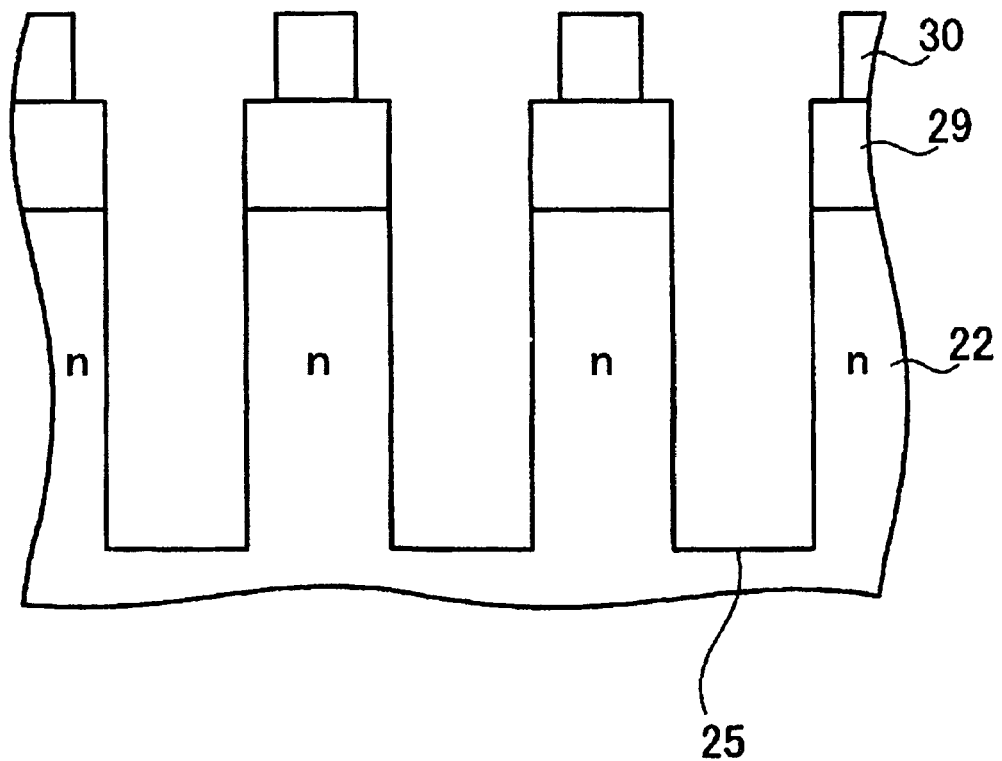
FIG. 18 is a sectional view showing the semiconductor device produced by the production method according to Embodiment 3.
Figure 19:
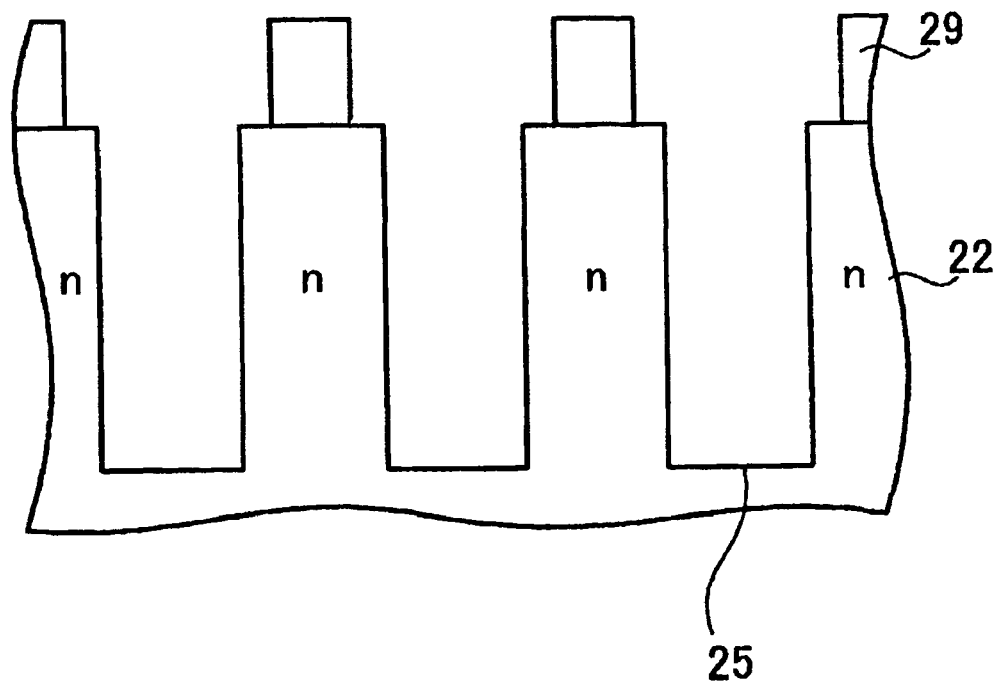
FIG. 19 is a sectional view showing the semiconductor device produced by the production method according to Embodiment 3.

Next, a resist film 30 is applied to the surface of the mask oxide film 29. Then, the resist film 30 is subjected to photolithography so that the width of the resist film 30 is made narrower than the width of the remaining mask oxide film 29 (FIG. 18). At this time, the resist film 30 is positioned at the nearly central position on the surface of the mask oxide film 29. Next, etching is performed by using the remaining resist film 30 as a mask, whereby the width of the mask oxide film 29 is narrowed so that only the central portion of the mask oxide film 29 remains. Hence, the portions of the n-type semiconductor 22 close to the opening ends of the trenches 25 (second exposed portions) are exposed. Then, the resist film 30 is removed (FIG. 19).

Figure 20:
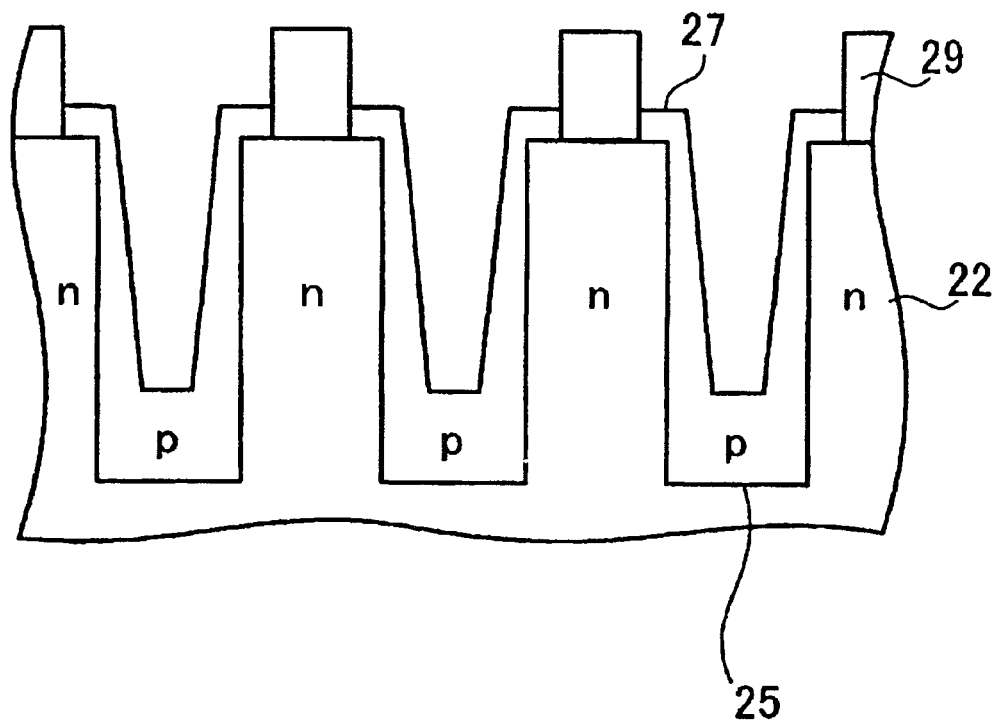
FIG. 20 is a sectional view showing the semiconductor device produced by the production method according to Embodiment 3.
Figure 21:
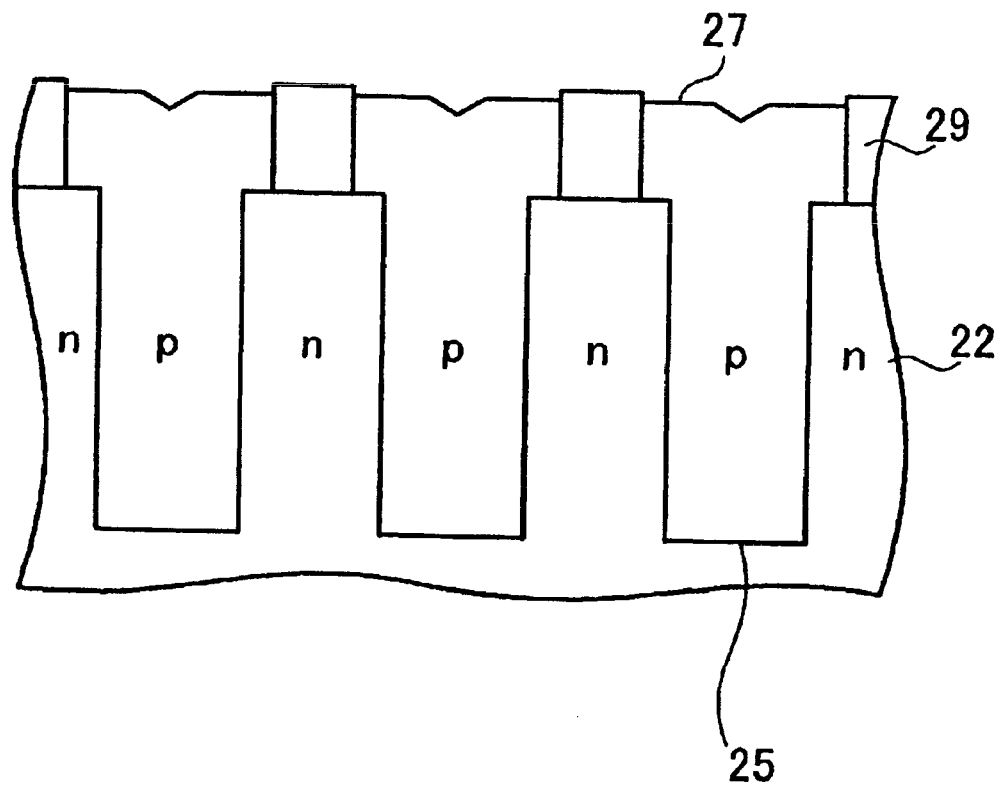
FIG. 21 is a sectional view showing the semiconductor device produced by the production method according to Embodiment 3.
Figure 22:
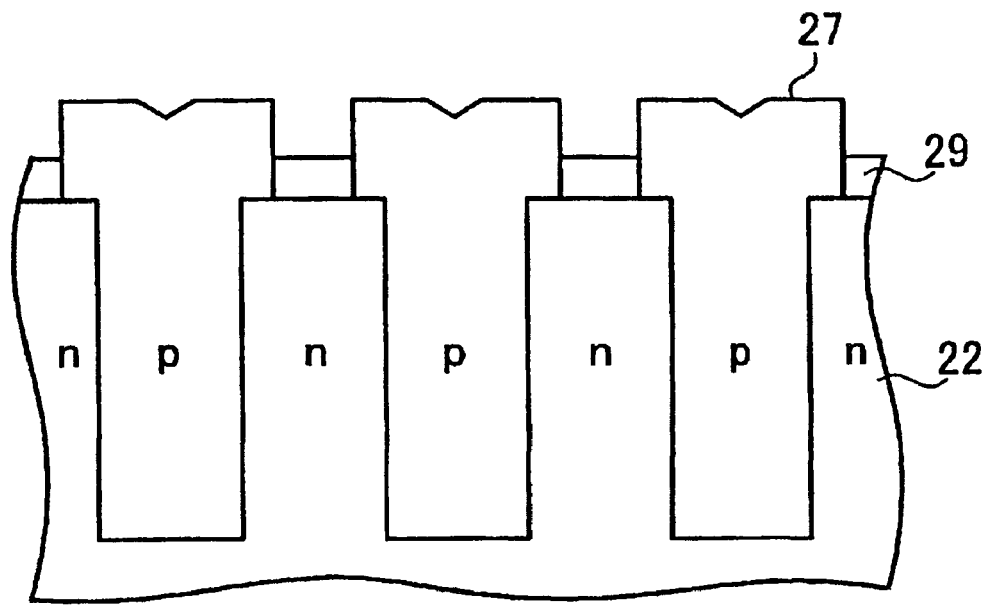
FIG. 22 is a sectional view showing the semiconductor device produced by the production method according to Embodiment 3.

Next, as in Embodiment 1, the semiconductor device is subjected to heat treatment, whereby the inner faces of the trenches 25 (the side and bottom faces of the trenches) are smoothed. Then, as shown in FIG. 20, the p-type semiconductor 27 is grown inside the trenches 25 by the epitaxial growth method. At this time, the p-type semiconductor 27 is also grown from the second exposed portions of the n-type semiconductor 22. Then, the p-type semiconductor 27 is grown continuously, whereby the trenches 25 are embedded with the p-type semiconductor 27 as shown in FIG. 21. At this time, the trenches 25 are embedded with the p-type semiconductor 27 to a height as high as the surface of the n-type semiconductors 22 obtained after the surface of the parallel pn structure 4 is smoothed and to a height to the extent that V-shaped grooves do not remain on the surface of the parallel pn structure 4. However, since the mask oxide film 29 is thick, the surface of the p-type semiconductor 27 becomes lower than the surface of the mask oxide film 29. Then, the mask oxide film 29 is thinned by performing etching as shown in FIG. 22.

Figure 23:
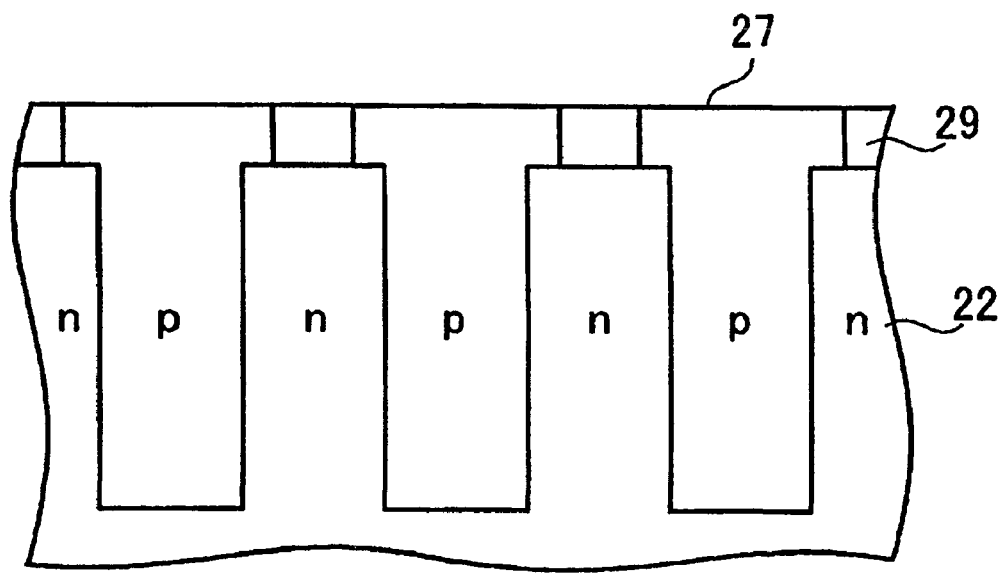
FIG. 23 is a sectional view showing the semiconductor device produced by the production method according to Embodiment 3.
Figure 24:
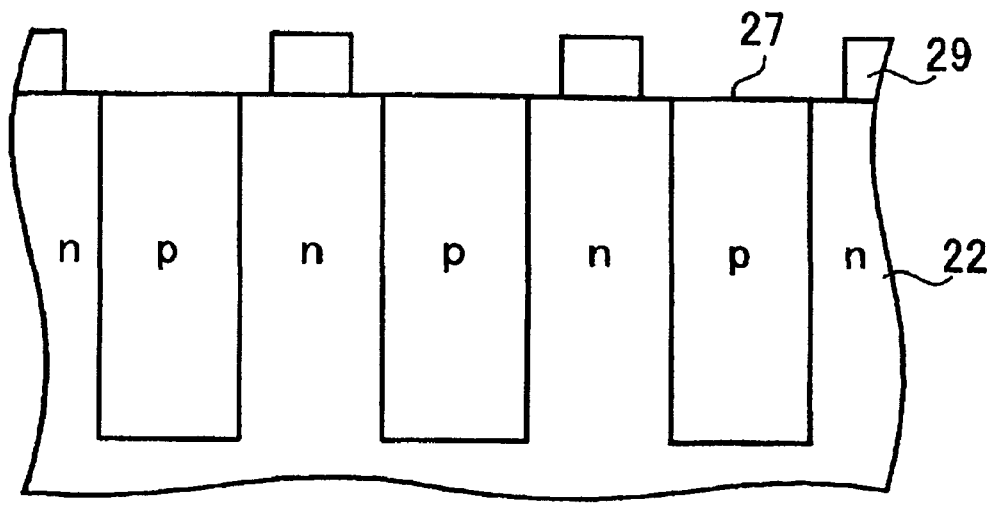
FIG. 24 is a sectional view showing the semiconductor device produced by the production method according to Embodiment 3.
Figure 25:
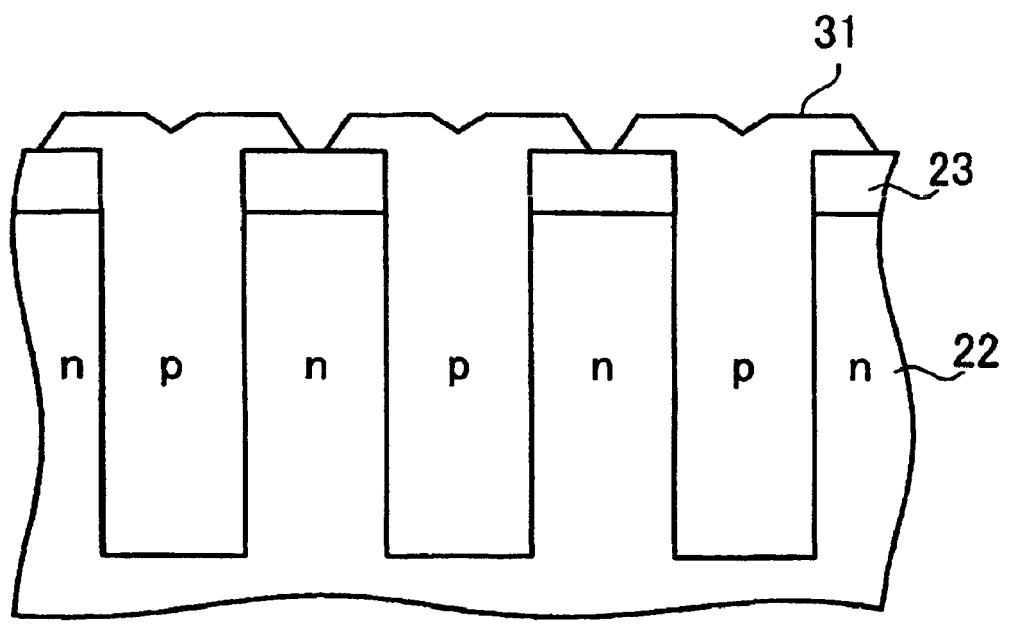
FIG. 25 is a sectional view showing a semiconductor device produced by a conventional production method.
Figure 26:
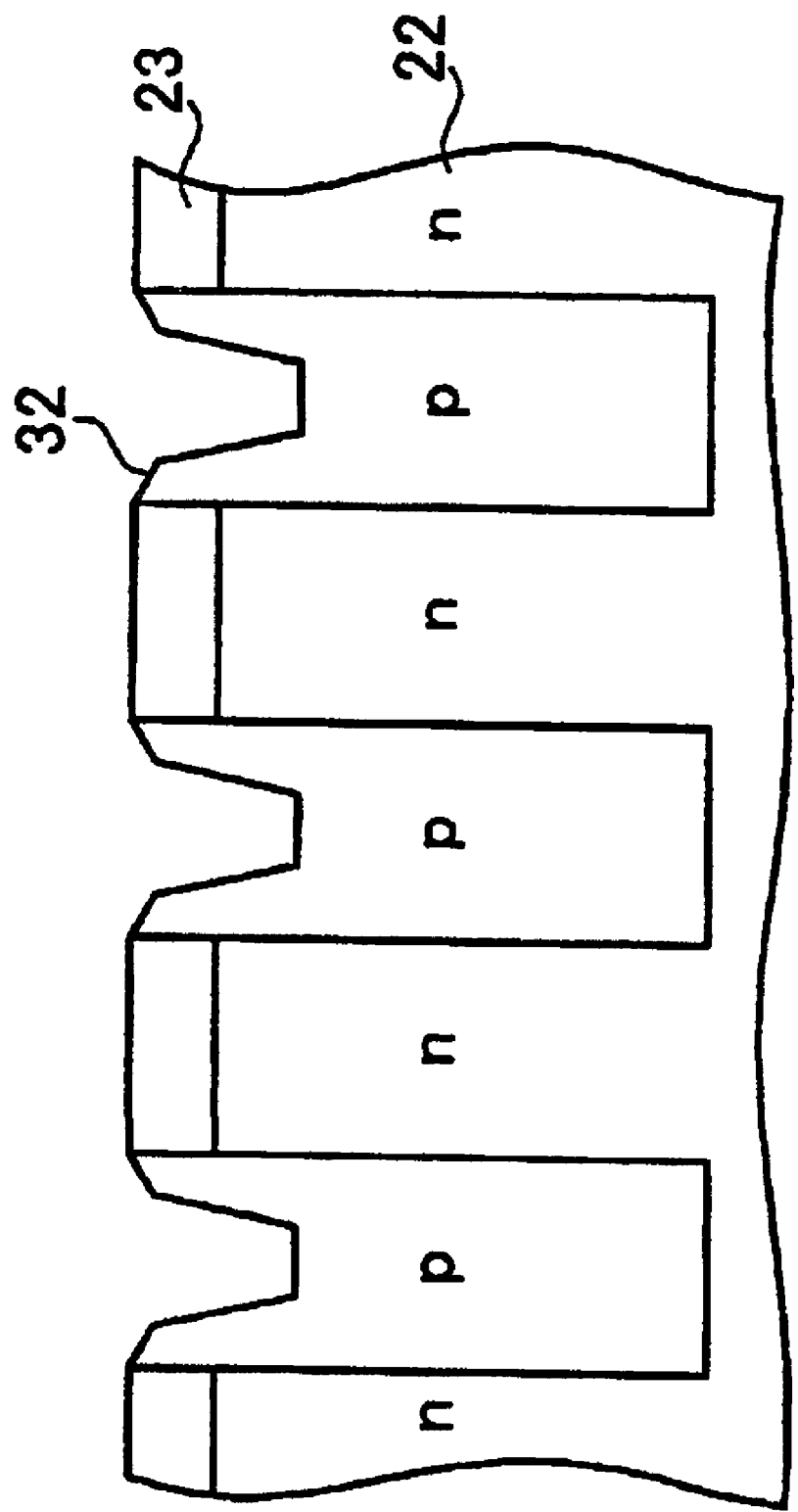
FIG. 26 is a sectional view showing another semiconductor device produced by another conventional production method.

Next, as shown in FIG. 23, the p-type semiconductor 27 protruding above the mask oxide film 29 is removed, while the level of the thinned mask oxide film 29 is used as the reference level at which the polishing is ended. Next, as shown in FIG. 24, the portions of the p-type semiconductor 27 protruding above the surface of the n-type semiconductor 22 are removed, whereby the surface of the semiconductor device is smoothed. The method for removing the p-type semiconductor 27 used at this time is similar to that described in Embodiment 1. Subsequent processes are similar to those described in Embodiment 1.

In Embodiment 3, the initial thickness of the mask oxide film 29 is 2.4 μm, for example. In addition, the thickness of the remaining portion of the mask oxide film 29 is 2.0 μm, for example, after the etching process for forming the trenches. Furthermore, by the etching for the mask oxide film 29 performed after the trenches 25 are embedded with the p-type semiconductor 27, the mask oxide film 29 is thinned to 0.8 μm, for example.

Even when the trenches are completely embedded with the p-type semiconductor 27, the thickness of the mask oxide film 29 is sufficiently large to the extent that the p-type semiconductor 27 is not grown on the surface of the mask oxide film 29. In addition, the effect of the second exposed portions of the n-type semiconductor 22 is similar to that of Embodiment 1.

As described above, Embodiment 3 can obtain effects similar to those of Embodiment 1.

The present invention described above is not limited to the above-mentioned embodiments but can be modified within the scope of the appended claims. For example, the values of the dimensions, concentrations, etc. described in the embodiments are merely given as examples, and the present invention is not limited to the values. In addition, although the trenches formed in the first conductive type semiconductor are formed to a depth not reaching the semiconductor substrate, trenches having a depth completely passing through the first conductive type semiconductor and reaching the semiconductor substrate may also be formed. Furthermore, although the first conductive type semiconductor is an n-type and the second conductive type semiconductor is a p-type in the above-mentioned embodiments, even if the first conductive type semiconductor is a p-type and the second conductive type semiconductor is an n-type, the present invention can be achieved similarly. Moreover, the present invention is not limited to be applied to MOSFETs, but is applicable to semiconductor devices, such as IGBTs, bipolar transistors and diodes. Still further, the present invention is not limited to be applied to a method for producing a parallel pn structure, but is applicable to a method for forming trenches in semiconductors.

As described above, the method for producing a semiconductor device according to the present invention is useful as a method for producing a semiconductor device including a trench forming process, more particularly, is suited for a method for producing a power semiconductor device having a super-junction structure.

The application is based on and claims priority to Japanese Application 2008-199793, filed on Aug. 1, 2008. The disclosure of the priority application in its entirety, including the drawings, claims, and the specification therefore, is incorporated herein buy reference.

What is claimed is:

1. A method for producing semiconductor device, comprising:
    a first masking step of forming a first mask being open partially on the main face of a first conductive type semiconductor substrate;
    a second masking step of laminating a second mask having a width narrower than that of the first mask on the surfaces of the remaining portions of the first mask;
    an etching step of forming trenches by etching the semiconductor portions of the first conductive type semiconductor substrate exposed to the opening portions in the first mask and the opening portions in the second mask;
    an exposing step of narrowing the width of the first mask by using the second mask, and exposing the semiconductor portions on the surface of the first conductive type semiconductor substrate, remaining without being etched after the etching step; and
    a layer forming step of epitaxially growing a second conductive type semiconductor layer in the trenches and the semiconductor portions of the first conductive type semiconductor substrate exposed in the exposing step.

2. The method for producing semiconductor device according to claim 1, wherein the first mask is an oxide film or a nitride film.

3. The method for producing semiconductor device according to claim 1, wherein the second mask is a resist film, a nitride film or an oxide film.

* * * * *